United States Patent [19]
Tsui et al.

[11] Patent Number: 6,070,263
[45] Date of Patent: May 30, 2000

[54] CIRCUIT FOR USE IN A VITERBI DECODER

[75] Inventors: Chi-ying Tsui; Roger Shu Kwan Cheng, both of Clear Water Bay, The Hong Kong Special Administrative Region of the People's Republic of China

[73] Assignee: Motorola, Inc., Schaumburg, Ill.

[21] Appl. No.: 09/062,685

[22] Filed: Apr. 20, 1998

[51] Int. Cl.[7] ........................................... G06F 11/10
[52] U.S. Cl. .................... 714/795; 794/796; 375/262; 375/265; 375/341
[58] Field of Search .................... 714/795, 796, 714/794; 375/262, 265, 341; 704/242

[56] References Cited

U.S. PATENT DOCUMENTS

| | | | |
|---|---|---|---|
| 5,928,378 | 7/1998 | Choi | 714/795 |
| 5,946,361 | 8/1999 | Araki et al. | 375/341 |
| 5,960,011 | 9/1999 | Oh | 714/789 |

*Primary Examiner*—Albert De Cady
*Assistant Examiner*—Esaw Abraham
*Attorney, Agent, or Firm*—Lanny L. Parker

[57] ABSTRACT

A circuit for use in the add-compare-select circuit of a Viterbi decoder to determine the maximum likelihood path through states in a coding trellis uses a modified butterfly structure. Selection registers select between branch metric values at time i and partial path metric values at time i–1 in dependence on comparisons of branch metric difference values at time i and partial path metric difference values at time i–1. The selected values are added to provide new partial path metric at time i. The circuit provides a significant reduction in power consumption and area over conventional designs.

6 Claims, 4 Drawing Sheets

CIRCUIT FOR USE IN A VITERBI DECODER

FIELD OF THE INVENTION

This invention relates to a circuit for use in a Viterbi decoder.

BACKGROUND OF THE INVENTION

A Viterbi decoder is a common type of maximum-likelihood trellis decoder used for the decoding of convolutional code. A Viterbi decoder typically consists of three units: a branch metric unit (BMU) for generating the branch metrics of all possible transitions between all pairs of states in a given coding trellis; an add-compare-select unit (ACSU) for calculating partial path metrics entering each state by adding the branch metric of a particular transition to its corresponding partial path metric and comparing the resultant partial path metrics to select the survivor path of a particular state, and a survivor memory unit (SMU) for storing the selected survivor paths for construction of the decoded sequence.

Typically, for each decoded bit, the number of operations which must be performed by the ACSU is significantly larger than that by the BMU and the SMU, resulting in higher power consumption by the ACSU.

It is an object of this invention to provide a circuit for use in a Viterbi decoder in which power consumption may be reduced.

BRIEF SUMMARY OF THE INVENTION

In accordance with a first aspect of the present invention there is provided a circuit, for use in a Viterbi decoder, as claimed in claim 1.

In accordance with a second aspect of the present invention there is provided a selection signal generating circuit, for use in a Viterbi decoder, as claimed in claim 4.

BRIEF DESCRIPTION OF THE DRAWINGS

One embodiment of the invention will now be more fully described, by way of example only, with reference to the accompanying drawings, in which.

DETAILED DESCRIPTION OF THE DRAWINGS

Figure 1:
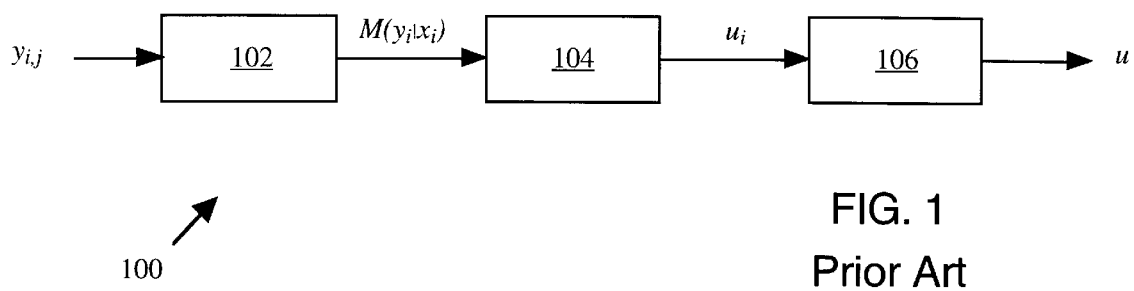
FIG. 1 shows a block diagram illustration of the processing units of a typical prior art Viterbi decoder circuit.

Referring firstly to FIG. 1, a Viterbi decoder is a type of maximum likelihood decoder used for the decoding of convolutional code. The Viterbi algorithm, when applied to a received sequence γ from a discrete memoryless channel, finds the path through the trellis (of all possible states) with the largest (or smallest) metric (i.e., the maximum likelihood path). The algorithm processes y in an iterative manner. At each step, it compares the partial path metrics of all paths entering each state of the trellis and stores the path with the largest (or smallest) metric, called the survivor, together with its metric. In the following, the minimum metric is used as the best metric. As shown in FIG. 1, the structure of a Viterbi decoder circuit 100 typically consists of three units:

1. Branch Metric Unit (BMU) 102: The branch metric unit generates branch metrics for all possible transitions between all pairs of states in the given trellis.

2. Add-Compare-Select Unit (ACSU) 104: To find the survivor path entering each state, the branch metric of a given transition is added to its partial path metric stored in the path metric memory (PMM). This new partial path metric is compared with all the other new partial path metrics corresponding to all the other transitions entering that state. The transition which has the minimum partial path metric is selected to be the survivor path of that state. The path metric of the survivor path of each state is updated and stored back in the PMM.

3. Survivor Memory Unit (SMU) 106: The survivor paths are stored in the SMU. A trace back mechanism is applied on the SMU during the decoding stage to output the decoded sequence u.

For the CDMA coding standard IS-95, the code rate is ½ and there are two competitive paths arriving at each state at each cycle. In this description, a partial path metric of a path entering state s at time cycle i is denoted as $M_i^{(s)}$ and the branch metric of the transition from state $s_i$ to state s at time cycle i as $BM_i^{(s_i,s)}$. The new partial path metrics of the two competitive paths ($m_1$ and $m_2$) from states $s_1$ and $s_2$ to state s at time cycle i are expressed as:

$$M_i^{(s)}(m_1) = M_{i-1}^{(s_1)} + BM_i^{(s_1,s)}$$
$$M_i^{(s)}(m_2) = M_{i-1}^{(s_2)} + BM_i^{(s_2,s)}.$$

After the new path metrics are calculated, the following comparison is carried out to find which is the lesser:

$$M_i^{(s)} = \min(M_i^{(s)}(m_1), M_i^{(s)}(m_2))$$

where $M_i^{(s)}$ stands for the partial path metric of the survivor path entering the state s at time i.

For IS-95, there are 256 states and 512 add operations and 256 compare and select operations have to be performed for every decoded bit. Comparing with other units such as the BMU and the SMU, the number of operations which must be performed by the ACSU is significantly larger and hence the power consumed inside the ACSU is much higher.

Figure 2:
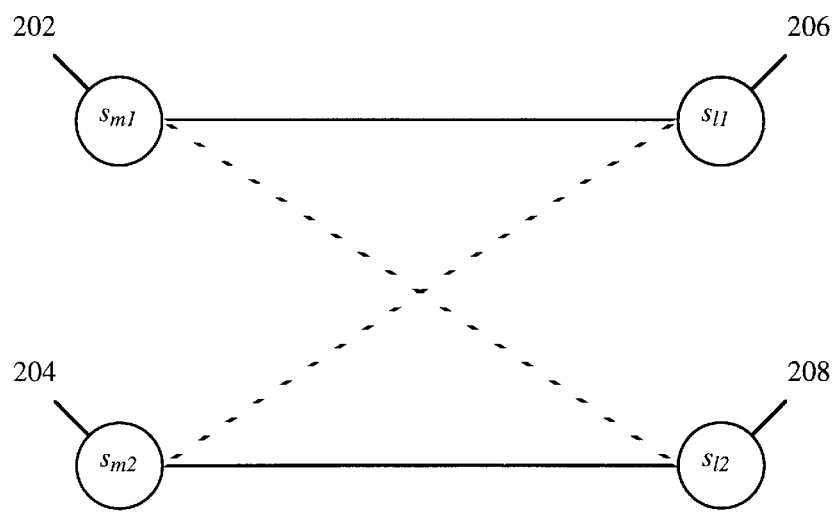
FIG. 2 shows a diagrammatic representation of the cross-coupled or 'butterfly' structure typically employed in the Add-Compare-Select Unit (ACSU) of the Viterbi decoder circuit of FIG. 1.

Referring now also to FIG. 2, in a conventional ACSU circuit, the ACSU is organised in a cross-coupled or 'butterfly' structure 200 as shown. Generally, in order to perform 1 ACSU operation, an ACSU circuit has to read two path metrics from the PMM. For IS-95 forward link convolutional code, the two paths merging at state $s_{l1}$ (206) at time i in the trellis diagram are coming from the two states $S_{m1}$ (202) and $S_{m2}$ (204), at time i−1 where the binary values of the index m1 and m2 differ only by the most significant bit (MSB). Moreover, the two paths also merge at another state $s_{l2}$ (208) at time i, and the binary values of the index l1 and l2 differ only by the least significant bit (LSB). To reduce the number of read accesses to the PMM, the ACSU operations to calculate survivor paths at the states $s_{l1}$ and $s_{l2}$ should be performed together.

If $y_n$ is a received symbol and k is the number of bits of precision (usually k is 4 for the IS-95 standard), then given the received symbols ($y_n$, $y_{n+1}$), the branch metric is either one of the four following values: $(y_n+y_{n+1})$, $-(y_n+y_{n+1})$, $(y_{n-}y_{n+1})$ or $-(y_n-y_{n+1})$. Therefore, the bit precision number of the branch metric is k+1. For the path metric memory, to avoid overflow over time due to the fact that the memory has finite bit width, the conventional approach is to re-normalise the path metrics by subtracting a constant from all the path metrics to be compared so that the memory will not overflow. However, this increases the number of unnecessary operations in the ACSU. In the publication Proceedings of IEEE Conference on Communications, 1990, page 1759, by C. B. Shung, D. H. Siegel, G. Ungerboeck and H. K. Thager, entitled "VLSI Archtectures for Metric Normalization in the Viterbi Algorithm", it is demonstrated that if the memory storing the path metrics is of length $2D_{max}$, where $D_{max}$ is the maximum possible difference between the path metrics, then overflowing of the path metrics will not cause any errors in the decoder. In the publication Proceedings of IEEE 46th Vehicular Technology Conference, pp. 1346–1350, 1996, by H. Lou, entitled "Viterbi Decoder Design for IS-95 CDMA Forward Link", it is shown that the maximum number of bits required for both computing and storing the path metrics is 9 bits for the IS-95 standard. To compare two path metrics, it is necessary to compute the $(n-1)^{th}$ bit of the result of a straightforward 2's complement subtraction of the two n-bit numbers to be compared (in this case n=9). The value represented by the bits 0 to n−2 is the amount of difference between the two path metrics. Therefore, when carrying out the operation min $(M_i^{(s)}(m_1), M_i^{(s)}(m_2))$, it is necessary to perform a subtraction instead of doing a simple binary number comparison.

Figure 3:
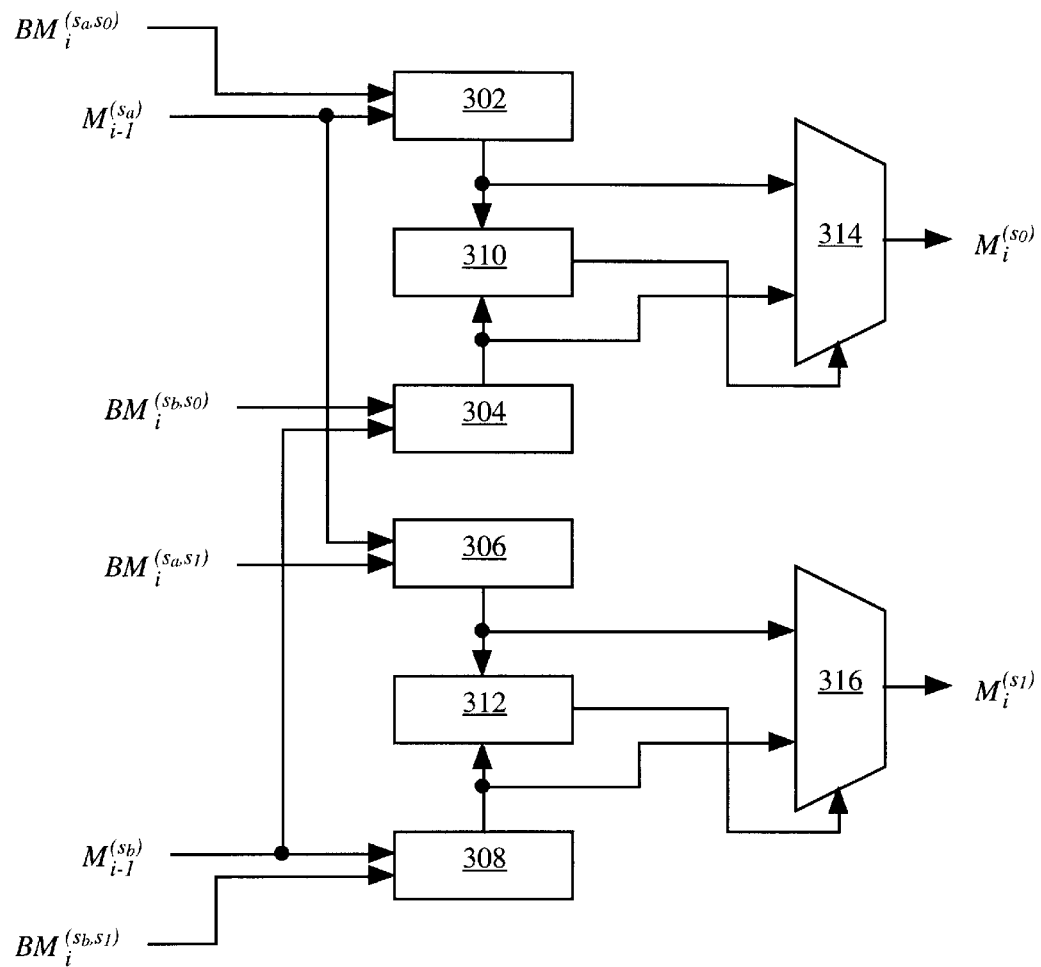
FIG. 3 shows a more detailed schematic circuit diagram of a typical implementation of the Add-Compare-Select Unit (ACSU), employing the 'butterfly' structure of FIG. 2.

FIG. 3 shows the circuit 300 of a conventional VLSI architecture for implementing an ACSU 'butterfly' unit of a Viterbi decoder. As depicted in FIG. 3, $BM_i^{(s,s0)}$ and $BM_i^{(s,s1)}$ represent the branch metrics of transition from state s to states $s_0$ and $s_1$, respectively. These also represent the branch metrics of transition from state s with the incoming bit being 0 and 1, respectively. The circuit employs cross-coupled pairs of adder units 302 & 304 and 306 & 308 for calculating the required partial path metrics, comparator units 310 and 312 for comparing the partial path metrics calculated by the adder units 302 & 304, and 308 & 310 respectively, and selection registers 314 and 316 for selecting the minimum calculated partial path metric in each pair in response to the result of the relevant comparison.

The number of arithmetic calculations required to produce the two new path metrics for the conventional scheme of FIG. 3 described above is summarised in the following table, assuming the numbers of bits used to represent the path metric and the branch metric are 9 and 5 respectively:

| Operation | Type |
|---|---|
| $M_i^{(s0)}(m) = M_{i-1}^{(sa)} + BM_i^{(sa,s0)}$ | 9 to 5 bit addition |
| $M_i^{(s1)}(m) = M_{i-1}^{(sa)} + BM_i^{(sa,s1)}$ | 9 to 5 bit addition |
| $M_i^{(s0)}(m') = M_{i-1}^{(sb)} + BM_i^{(sb,s0)}$ | 9 to 5 bit addition |
| $M_i^{(s1)}(m') = M_{i-1}^{(sb)} + BM_i^{(sb,s1)}$ | 9 to 5 bit addition |
| $M_i^{(s0)} = \min(M_i^{(s0)}(m), M_i^{(s0)}(m'))$ | 9 bit comparison (subtraction) and select |
| $M_i^{(s1)} = \min(M_i^{(s1)}(m), M_i^{(s1)}(m'))$ | 9 bit comparison (subtraction) and select |

Figure 4:
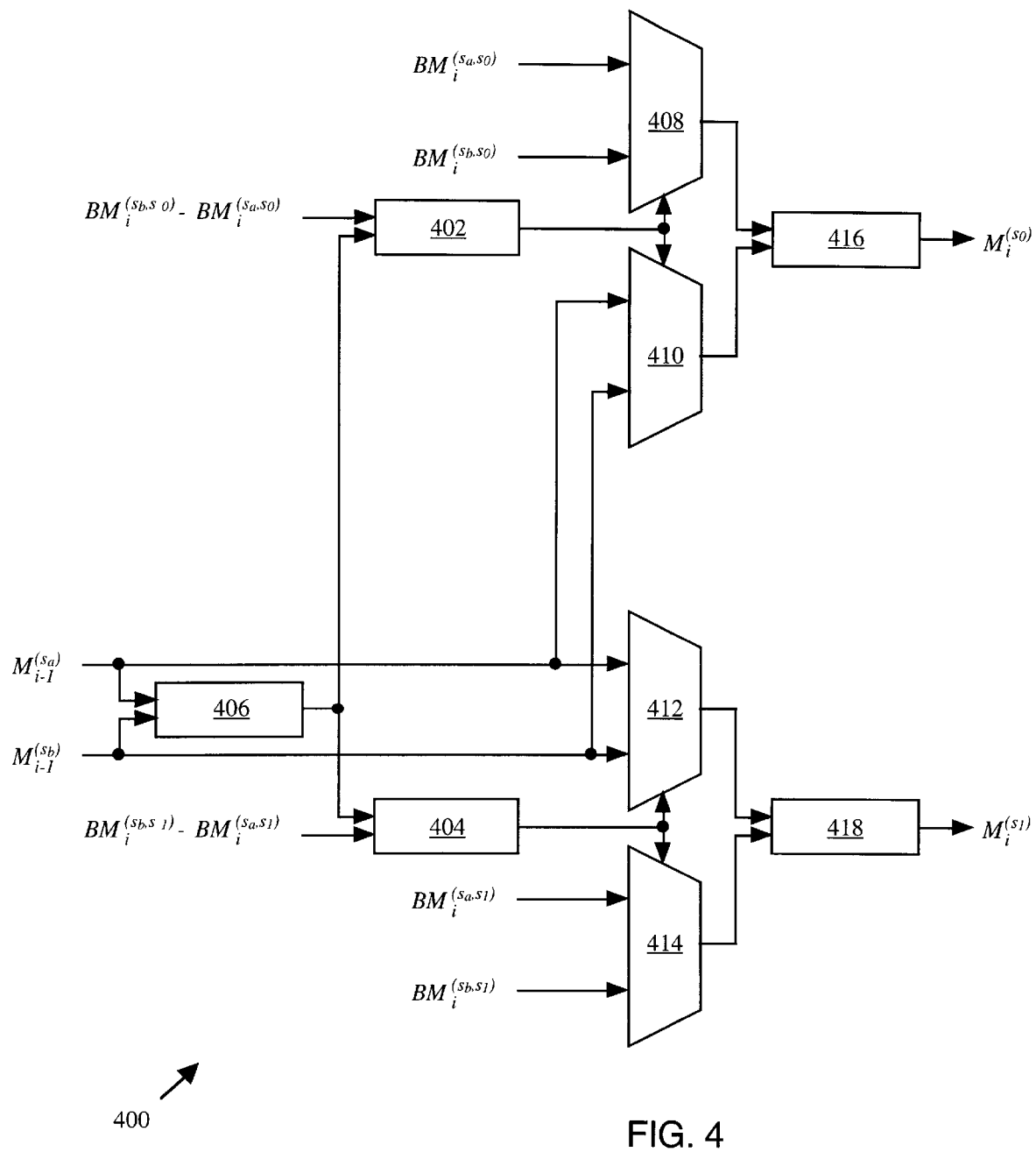
FIG. 4 shows a schematic circuit diagram of a novel implementation of the Add-Compare-Select Unit (ACSU) for a Viterbi decoder circuit offering reduced power consumption.

Referring now to FIG. 4, in accordance with the present invention, a novel ACSU circuit for a Viterbi decoder offers reduced complexity and reduced power consumption. The novel ACSU circuit of FIG. 4 has two features that can minimize power consumption of the ACSU. Firstly, the butterfly operation is re-arranged to reduce the number of operations required. Secondly, a pre-computation technique is used to further reduce the number of operations required during run-time.

The re-arrangement of the 'butterfly' operation is based upon the following analysis by the inventors. For calculating $M_i^{(s0)}$, instead of finding min $(M_{i-1}^{(sa)}+BM_i^{(sa,s0)}, M_{i-1}^{(sb)}+BM_i^{(sb,s0)})$, a comparison can be made of the values of $(M_{i-1}^{(sa)}-M_{i-1}^{(sb)})$ and $BM_i^{(sb,s0)}-BM_i^{(sa,s0)}$. If the former value is larger, it means that $(M_{i-1}^{(sa)}-M_{i-1}^{(sb)}) > (BM_i^{(sb,s0)}-BM_i^{(sa,s0)})$, and vice versa. For calculating $M_i^{(s1)}$, a comparison can be made of the values of $(M_{i-1}^{(sa)}-M_{i-1}^{(sb)})$ and $BM_i^{(sb,s1)}-BM_i^{(sa,s1)}$. It is to be noted that both calculations share the value $(M_{i-1}^{(sa)}-M_{i-1}^{(sb)}$, hence allowing one computation to be saved by not computing this value twice. It is also to be noted that additions/subtractions are carried out with smaller bit-width. FIG. 4 summarises the new ACSU butterfly operation.

As shown in FIG. 4, the novel ACSU circuit 400 employs cross-coupled comparator units 402 and 404 for comparing pre-calculated branch metric differences and a path metric difference produced by a subtractor unit 406. The comparator units 402 and 404 control selection registers 408 & 410 and 412 & 414 which receive appropriate path metric values and branch metric values. The selected metric values from the selection registers are added in adder units 416 and 418 to produce the new path metrics.

As will be discussed in further detail below, the difference of the branch metric is pre-computed and hence does not need to be calculated every time. For the convolutional code specified in the IS-95 standard, the two branch metrics $BM_i^{(sa,s1)}$ and $BM_i^{(sb,s1)}$ have the same magnitude but different sign, making their difference equal to a value twice that of the corresponding branch metric with the appropriate sign. The number of bits required to represent the difference is 6. The number of arithmetic calculations required to produce the two new path metrics using the new scheme is summarised in the following table:

| Operation | Type |
|---|---|
| $M = M_{i-1}^{(s0)} - M_{i-1}^{(sb)}$ | 9 bit subtraction |
| compare $(M, BM_i^{(sb,s0)} - BM_i^{(sa,s0)})$ | 9 to 6 bit comparison and select |
| compare $(M, BM_i^{(sb,s1)} - BM_i^{(sa,s1)})$ | 9 to 6 bit comparison and select |
| $M_i^{(s0)} = M_{i-1}^{(s^*)} + BM_i^{(s^*,s0)}$ | 9 to 5 bit addition |
| $M_i^{(s1)} = M_{i-1}^{(s')} + BM_i^{(s',s1)}$ | 9 to 5 bit addition |

A comparison between the immediately foregoing table and the table discussed above in relation to the conventional ACSU architecture of FIG. 3 shows that the new CSU circuit 400 of FIG. 4 requires one less 9 bit addition operation. Also, it will be seen that the comparison operations in the new architecture are mostly 6 bit operations, compared with the 9 bit compare operations required under the conventional architecture. For these reasons it will be understood that the new circuit 400 of FIG. 4 is less complex and has lower power consumption than the conventional circuit 300 of FIG. 3.

Figure 5:
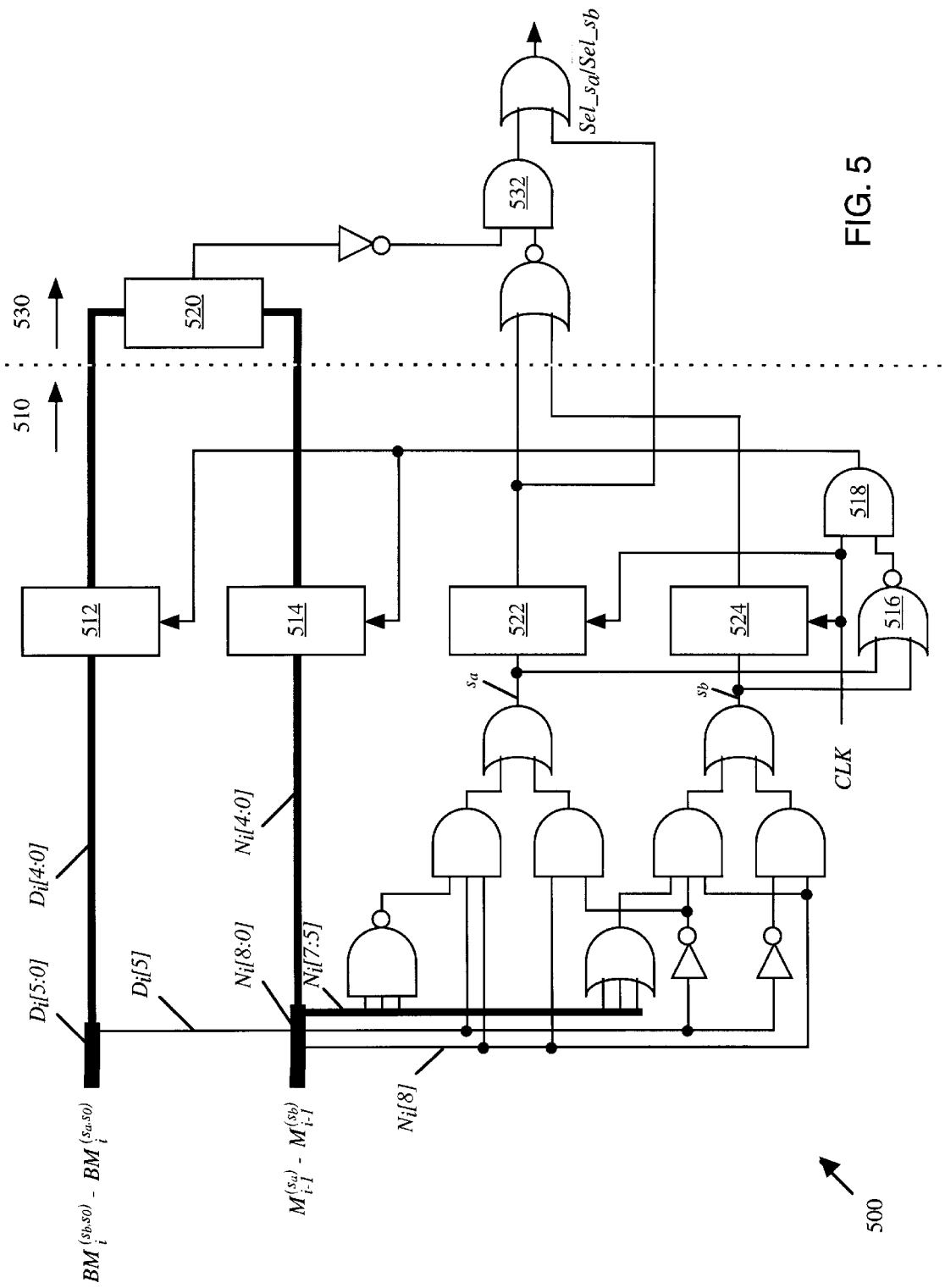
FIG. 5 shows a schematic circuit diagram of a pre-computation circuit for use with the circuit of FIG. 4, offering a further reduction in power consumption.

Referring now also to FIG. 5, in an enhancment to the new circuit 400 of FIG. 4 the power consumption of the circuit 400 is further reduced by reducing the number of comparisons required during the operation of the ACSU. As discussed above, in the new circuit 400, comparison is done on a 9 bit data value and a 6 bit data value. In this enhancement, instead of performing a 9 bit comparison, the four most significant bits of the 9 bit data value and the most significant bit (the sign bit) of the 6 bit data value are used to pre-determine whether the 9 bit data value is larger (or smaller), and if this determination cannot be made, then a 5 bit comparator is used to compare the 6 bit data value (whose 5 LSBs only need be used for magnitude comparison) with the 5 LSBs of the 9 bit data value. This comparison methodology may be summarised as follows:

Let $N_i[8:0]$ be equal to $M_{i-1}^{(s_a)} - M_{i-1}^{(s_b)}$, and
let $D_i[5:0]$ be equal to $BM_i^{(s_b, s_0)} - BM_i^{(s_a, s_0)}$.

There are four different cases when K is compared with $D_i$:

1. If $N_i > 0$ and $D_i < 0$ (i.e., $N_i[8]=0$ and $D_i[5]=1$) then $(M_{i-1}^{(s_a)} + BM_i^{(s_a, s_0)}) > (M_{i-1}^{(s_b)} + BM_i^{(s_b, s_0)})$ and $s_b$ should be selected.

2. If $N_i < 0$ and $D_i > 0$ (i.e., $N_i[8]=1$ and $D_i[5]=0$) then $(M_{i-1}^{(s_a)} + BM_i^{(s_a, s_0)}) < (M_{i-1}^{(s_b)} + BM_i^{(s_b, s_0)})$ and $s_a$ should be selected.

3. If $N_i > 0$ and $D_i > 0$ (i.e., $N_{i[8]=0}$ and $D_{i[5]=0}$) then it is necessary to compare the magnitude of $M_{1-1}^{(s_a)} - M_{i-1}^{(s_b)}$ and $(BM_i^{(s_b, s_0)} - BM_i^{(s_a, s_0)})$ (i.e., $N_i[7:0]$ and $D_i[4:0]$). If either one of the bits of $N_i[7:5]$ is 1, then $N_i > D_i$ and $s_b$ should be selected; if not, a comparison of $N_i[4:0]$ and $D_i[4:0]$ must be performed to determine which is greater.

4. If $N_i < 0$ and $D_i < 0$ (i.e., $N_i[8]=1$ and $D_i[5]=1$) then it is necessary to compare the magnitude of $(M_{i-1}^{(s_a)} - M_{i-1}^{(s_b)})$ and $(BM_i^{(s_b, s_0)} - BM_i^{(s_a, s_0)})$ (i.e., $N_i[7:0]$ and $D_i[4:0]$). If either one of the bits of $N_i[7:5]$ is 0, then $|N_i| > |D_i|$ and $s_a$ should be selected; if not, a comparison of $N_i[4:0]$ and $D_i[4:0]$ must be performed to determine which is greater.

Following this comparison methodology, it can be seen that the selection condition can be pre-computed using $N_i[8:5]$ and $D_i[5]$ to determine whether $N_i > D_i$ or $N_i < D_i$, so that the number of 5 bit comparisons is reduced. This can further reduce the power consumption of the ACSU. The 5 bit comparator is operating only when both $N_i$ and $D_i$ have the same sign. In both situations, the 5 bit comparator can just compare the magnitude of $N_i[4:0]$ and $D_i[4:0]$ to determine whether $N_i > D_i$, irrespective of the sign. Therefore the comparator can be implemented as a simple bit-by-bit serial comparator instead of using subtraction.

FIG. 5 shows a circuit 500 which is used, in place of the 9 bit comparator 402 unit to generate the selection signal (for selecting which one of two possible metric values should be added) by implementing this pre-computation concept.

A two-stage pipeline (510, 530) is used to calculate the decision signal $$Sel\_s_a / \overline{Sel\_s_b}$$

for selecting the metric to add. In the first pipeline stage 510, $N_i[8:5]$ and $D_i[5]$ are used to pre-compute the condition of selecting the $s_a$ or $s_b$. When the condition is detected, i.e., either one of the signals $s_a$ and $s_b$ is 1, the clock signal CLK going to two 5 bit registers 512 and 514 (which respectively receive the values $D_i[4:0]$ and $N_i[4:0]$) is gated (via inverted OR gate 516 and AND gate 518) to 0. The values at the registers' outputs will not change and hence no power will be consumed in 5 bit comparator 520. At the same time, the signals $s_a$ and $s_b$ will latch in two 1 bit registers 522 and 524 respectively.

At the second pipeline stage 530, the output of the 5 bit comparator 520 is used together with the signals latched $s_a$ and $s_b$ from the latches 522 and 524 to generate the decision signal $$Sel\_s_a / \overline{Sel\_s_b}.$$

If either one of the signals $s_a$ and $s_b$ is 1, the output of the comparator 520 is disabled by AND gate 532, and the output of the decision signal $$Sel\_s_a / \overline{Sel\_s_b}$$

follows the value $s_a$. If both signals $s_a$ and $s_b$ are 0, the output of the comparator 520 determines the value of the decision signal.

Thus, it will be appreciated that, using the pre-computation scheme of this enhancement, 9 to 6 bit comparators are replaced with 5 bit comparators, and the number of 5 bit comparisons is reduced depending on the differences of the path metrics and the differences of the branch metrics. The additional overhead is small.

It will also be appreciated that the 9 to 6 bit comparator 404 in FIG. 4 is advantageously replaced by a 5 bit comparator circuit analogous to the circuit 500 of FIG. 5 which replaces the comparator 402.

Tests comparing the new circuit 400 of FIG. 4 with the conventional ACSU 300 of FIG. 3 have shown that, in decoding a signal encoded with the IS-95 standard, area and power consumption can be reduced by more than 20% and 30% respectively.

It will also be appreciated that although the preferred embodiment of the invention has been described in relation to a circuit for use in a viterbi decoder to decode signals convolutionally encoded in accordance with the CDMA coding standard IS-95, the invention is not limited to use with this coding standard and may alternatively be used advantageously with other coding standards.

What is claimed is:

1. A circuit for use in a Viterbi decoder to decode an input signal in dependence on metric values representing branch metrics between different states in a predetermined coding trellis to derive a maximum likelihood path, the circuit comprising:

first and second selection register means for receiving and producing a selected value from
a first metric value representative of the trellis path to a first state at a first time, and
a second metric value representative of the trellis path to a second state at the first time;

third selection register means for receiving and producing a selected value from
a first branch metric value representing the branch from the first state to a third state at a second time following the first time, and
a second branch metric value representing the branch from the second state to the third state at the second time;

fourth selection register means for receiving and producing a selected value from
a third branch metric value representing the branch from the first state to a fourth state at the second time, and
a fourth branch metric value representing the branch from the second state to the fourth state at the second time;

first comparator means for receiving and comparing
a first difference metric value representative of the difference between the metric to the first state at the first time and the metric to the second state at the first time, and a first difference branch metric value representative of the difference between the branch metric from the second state to the third state at the second time and the branch metric from the first state to the third state at the second time, the first comparator means being coupled to the first selection register means for selecting an input thereof in dependence on the first comparator means' comparison and being coupled to the third selection register means for selecting an input thereof in dependence on the first comparator means' comparison;

second comparator means for receiving and comparing the difference metric value, and a second difference branch metric value representative of the difference between the branch metric from the second state to the fourth state at the second time and the branch metric from the first state to the fourth state at the second time;

the second comparator means being coupled to the second selection register means for selecting an input thereof in dependence on the second comparator means' comparison and being coupled to the fourth selection register means for selecting an input thereof in dependence on the second comparator means' comparison;

first addition means for receiving and adding the selected value from the first selection register means and the selected value from the third selection register means to produce a value representative of the path metric to the third state at the second time; and second addition means for receiving and adding the selected value from the second selection register means and the selected value from the fourth selection register means to produce a value representative of the path metric to the fourth state at the second time.

2. A circuit as claimed in claim 1 for use in a Viterbi decoder to decode an input signal encoded in accordance with IS-95 standard coding, wherein the first and second comparator means are each arranged to perform a comparison between a 9 bit value and a 6 bit value.

3. A circuit as claimed in claim 1 for use in a Viterbi decoder to decode an input signal encoded in accordance with IS-95 standard coding, wherein the first and second comparator means are each arranged to perform an addition between a 9 bit value and a 5 bit value.

4. A selection signal generating circuit for use in a Viterbi decoder to decode an input signal in dependence on metric values representing branch metrics between different states in a predetermined coding trellis to derive a maximum likelihood path, the circuit comprising:

first logic means for receiving
a difference metric value representative of the difference between a first metric value representative of a first possible partial trellis path at a first time and a second metric value representative of a second possible partial trellis path at the first time, and
a difference branch metric value representative of the difference between the branch metric from a first state to a third state at a second time after the first time and the branch metric from the second state to a third state at the second time;
the first logic means producing a signal indicating, when a full comparison between the difference metric value and the difference branch metric value is not necessary, that the first state is to be selected or that the second state is to be selected; and third comparator means for receiving and, when necessary, producing an output from the comparison of the difference metric value and the difference branch metric value representative of the difference between the branch metric from a first state to a third state at a second time after the first time and the branch metric from the second state to a third state at the second time; and third logic means for receiving the outputs of the first logic means and the third comparator means for producing therefrom the selection signal.

5. A selection signal generating circuit as claimed in claim 4 for use in a Viterbi decoder to decode an input signal encoded in accordance with IS-95 standard coding, wherein the third comparator means is arranged to perform a comparison between the five least significant bits of its received values.

6. A selection signal generating circuit as claimed in claim 4, wherein the third comparator means comprises a bit-by-bit serial comparator.

* * * * *